(12) United States Patent
Jakobs

(10) Patent No.: US 7,737,742 B2
(45) Date of Patent: Jun. 15, 2010

(54) DELAY LOCKED LOOP

(75) Inventor: Andreas Jakobs, München (DE)

(73) Assignee: Qimonda AG, Munich (DE)

( * ) Notice: Subject to any disclaimer, the term of this patent is extended or adjusted under 35 U.S.C. 154(b) by 62 days.

(21) Appl. No.: 12/031,429

(22) Filed: Feb. 14, 2008

(65) Prior Publication Data

US 2009/0206896 A1    Aug. 20, 2009

(51) Int. Cl.
*H03L 7/06* (2006.01)
(52) U.S. Cl. .................... 327/158; 327/149
(58) Field of Classification Search ............. 327/149, 327/158
See application file for complete search history.

(56) References Cited

U.S. PATENT DOCUMENTS

| | | | |
|---|---|---|---|
| 7,010,014 B1 * | 3/2006 | Percey et al. ............. | 375/130 |
| 7,039,147 B2 | 5/2006 | Donnelly et al. | |
| 7,212,052 B2 | 5/2007 | Kim | |
| 7,557,628 B2 * | 7/2009 | Kim ....................... | 327/158 |
| 7,596,052 B2 * | 9/2009 | Ma ......................... | 365/233.1 |
| 2006/0197566 A1 | 9/2006 | Jakobs et al. | |
| 2006/0197567 A1 | 9/2006 | Jakobs et al. | |
| 2007/0096787 A1 | 5/2007 | Heightley | |
| 2007/0194820 A1 * | 8/2007 | Duggal .................... | 327/158 |
| 2008/0297215 A1 * | 12/2008 | Ma .......................... | 327/158 |
| 2009/0002041 A1 * | 1/2009 | Lin et al. ................. | 327/158 |
| 2009/0079481 A1 * | 3/2009 | Ma .......................... | 327/158 |
| 2009/0167379 A1 * | 7/2009 | Mobin et al. ............ | 327/149 |
| 2009/0184741 A1 * | 7/2009 | Suda et al. .............. | 327/158 |
| 2010/0014377 A1 * | 1/2010 | Ma .......................... | 365/233.1 |
| 2010/0060294 A1 * | 3/2010 | Suda ....................... | 324/555 |

* cited by examiner

*Primary Examiner*—Lincoln Donovan
*Assistant Examiner*—Adam D Houston
(74) *Attorney, Agent, or Firm*—Dicke, Billig & Czaja, PLLC

(57) ABSTRACT

An integrated circuit includes a chain of delay elements, a first phase detector, and a controller. The chain of delay elements is configured to delay an input clock signal for providing an output clock signal phase shifted with respect to the input clock signal by a selected value. The first phase detector is configured to provide a common control signal to each delay element based on a phase difference between the input clock signal and a signal output from one of the delay elements to adjust a delay of each delay element. The controller is configured to provide an independent control signal to each delay element to individually adjust the delay of each delay element such that the delay of each delay element is equal.

22 Claims, 3 Drawing Sheets

US 7,737,742 B2

DELAY LOCKED LOOP

BACKGROUND

In many electronic systems, data is synchronously transferred within or between different circuits by aligning the data to a periodic clock signal. Typically, to send and/or receive data, a derived clock signal is generated from a main system reference clock signal. The derived clock signal has a fixed, well defined phase relation to the main system reference clock signal. The derived clock signal is typically generated by a delay locked loop (DLL).

DLLs may be used to align data output from circuits, such as memory circuits, to the clock signal of a host. For example, in a double data rate (DDRx) synchronous dynamic random access memory (SDRAM), the data (DQ) written to the SDRAM is sent 90° in advance of the corresponding data strobe (DQS) signal. The DQS signal has a fixed timing relation (tDQSS) to the command clock (CLK) signal. For a read of the SDRAM, the DQ and DQS signals are specified to be edge aligned with the CLK signal. Therefore, an internal clock signal within the SDRAM is generated that runs in advance of the CLK signal by an amount equal to the combined delay through the output buffers.

A DLL receives a clock signal from a host or another suitable circuit and delays the clock signal to provide an output signal to align output data to the clock signal. The DLL compensates for differences in timing between the circuit and the host. Typically, a DLL includes a variable delay line that is controlled by a phase detector using closed loop regulation. The phase detector compares a feedback signal to the clock signal and outputs a control signal to adjust the delay of the delay line to set the phase difference between the clock signal and the feedback signal to a desired value.

In one embodiment, the variable delay line includes a chain of delay elements. Each delay element is assumed to provide an equal delay such that the desired phase relation between the input clock signal and the output clock signal is selected by tapping the output of a delay element. In practice, however, the delay elements typically do not have equal delays due to on-chip variations, which results in a non uniform resolution along the chain of delay elements. For some applications, this non uniform resolution along the chain of delay elements leads to errors.

For these and other reasons, there is a need for the present invention.

SUMMARY

One embodiment provides an integrated circuit. The integrated circuit includes a chain of delay elements, a first phase detector, and a controller. The chain of delay elements is configured to delay an input clock signal for providing an output clock signal phase shifted with respect to the input clock signal by a selected value. The first phase detector is configured to provide a common control signal to each delay element based on a phase difference between the input clock signal and a signal output from one of the delay elements to adjust a delay of each delay element. The controller is configured to provide an independent control signal to each delay element to individually adjust the delay of each delay element such that the delay of each delay element is equal.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
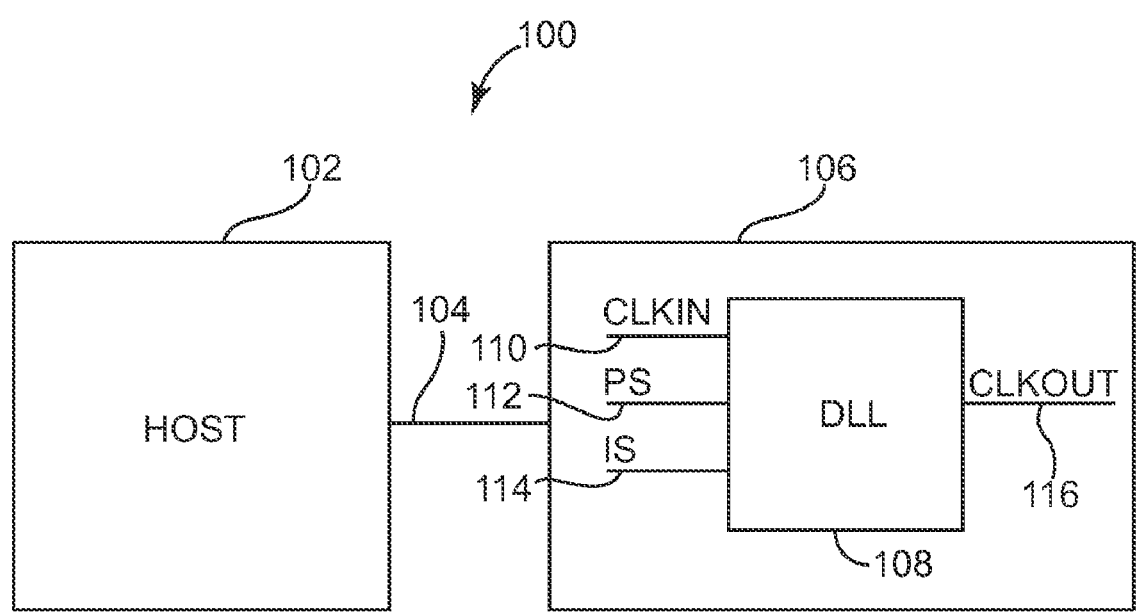
FIG. 1 is a block diagram illustrating one embodiment of a system.

FIG. 1 is a block diagram illustrating one embodiment of a system 100. System 100 includes a host 102 and a device 106. In one embodiment, device 106 is an integrated circuit or part of an integrated circuit. In one embodiment, device 106 is a memory device, such as a random access memory (RAM). In one embodiment, the random access memory is a synchronous dynamic random access memory (SDRAM), such as a double data rate (DDR) SDRAM, DDRII SDRAM, DDRIII SDRAM, or other suitable SDRAM. Host 102 is communicatively coupled to device 106 through communication link 104. In one embodiment, host 102 includes a computer (e.g., desktop, laptop, handheld), portable electronic device (e.g., cellular phone, personal digital assistant (PDA), MP3 player, video player, digital camera), or any other suitable device that uses memory. In one embodiment, device 106 provides memory for host 102.

Device 106 includes a delay locked loop (DLL) 108. A first input of DLL 108 receives an input clock (CLKIN) signal on CLKIN signal path 110. In one embodiment, the CLKIN signal is passed from host 102 to device 106 through communication link 104. A second input of DLL 108 receives a phase select (PS) signal on PS signal path 112. In one embodiment, the PS signal is passed from host 102 to device 106 through communication link 104. A third input of DLL 108 receives an interpolator select (IS) signal on IS signal path 114. In one embodiment, the IS signal is passed from host 102 to device 106 through communication link 104. DLL 108 outputs an output clock (CLKOUT) signal on CLKOUT signal path 116. DLL 108 includes a resolution adjustment controller for independently adjusting a delay of each delay element in a chain of delay elements such that the delay of each delay element is equal. In this way, DLL 108 provides a uniform resolution along the chain of delay elements.

DLL 108 receives the CLKIN signal and delays the signal through the chain of delay elements. The PS signal is used to tap the input and output signals of a delay element such that the input and output signals are passed to an interpolator. The IS signal determines how the input and output signals are interpolated to provide the CLKOUT signal. In one embodiment, based on the PS signal and the IS signal, DLL 108 delays the CLKIN signal to provide the CLKOUT signal, which is phase shifted from the CLKIN signal by a value between 0° and 180° with high resolution. In another embodiment, based on the PS signal and the IS signal, DLL 108 delays the CLKIN signal to provide the CLKOUT signal, which is phase shifted from the CLKIN signal by a value between 0° and 360° with high resolution. In one embodiment, information is synchronously transferred from device 106 to host 102 in response to the CLKOUT signal.

As used herein, the term "electrically coupled" is not meant to mean that the elements must be directly coupled together and intervening elements may be provided between the "electrically coupled" elements.

Figure 2:
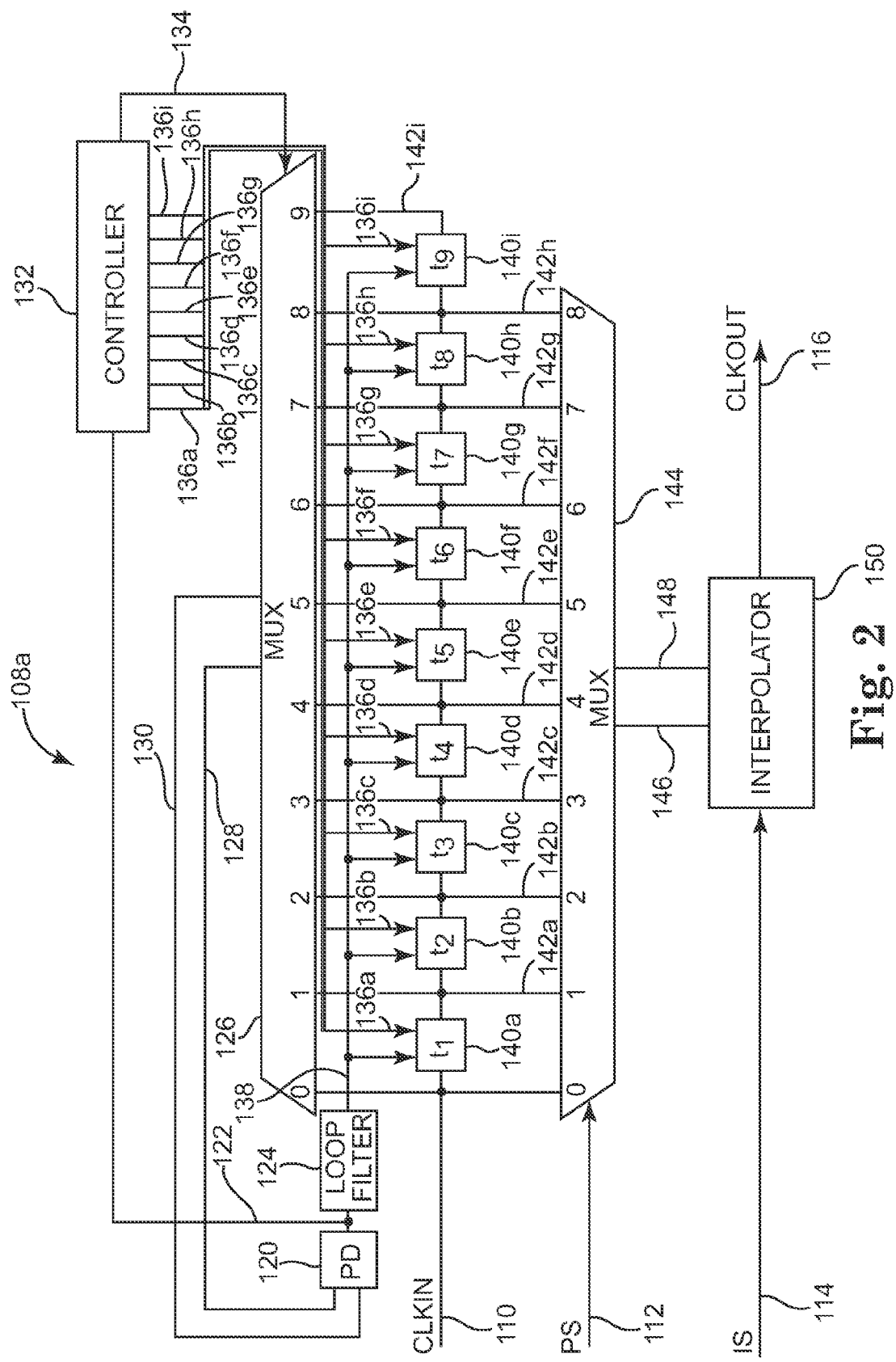
FIG. 2 is a block diagram illustrating one embodiment of a delay locked loop (DLL).

FIG. 2 is a block diagram illustrating one embodiment of a DLL 108a. In one embodiment, DLL 108a provides DLL 108 previously described and illustrated with reference to FIG. 1. DLL 108a includes a phase detector (PD) 120, a loop filter 124, a controller 132, multiplexers (MUXs) 126 and 144, a chain of delay elements 140a-140i, and an interpolator 150. The output of phase detector 120 is electrically coupled to the input of controller 132 and the input of loop filter 124 through signal path 122. The output of loop filter 124 is electrically coupled to a first control input of each delay element 140a-140i through signal path 138. A first output of controller 132 is electrically coupled to the control input of multiplexer 126 through signal path 134. Other outputs of controller 132 are electrically coupled to second control inputs of delay elements 140a-140i through signal paths 136a-136i, respectively.

Input 0 of multiplexer 126, an input of delay element 140a, and input 0 of multiplexer 144 receive the CLKIN signal on CLKIN signal path 110. The output of delay element 140a is electrically coupled to input 1 of multiplexer 126, an input of delay element 140b, and input 1 of multiplexer 144 through signal path 142a. The output of delay element 140b is electrically coupled to input 2 of multiplexer 126, an input of delay element 140c, and input 2 of multiplexer 144 through signal path 142b. The output of delay element 140c is electrically coupled to input 3 of multiplexer 126, an input of delay element 140d, and input 3 of multiplexer 144 through signal path 142c. The output of delay element 140d is electrically coupled to input 4 of multiplexer 126, an input of delay element 140e, and input 4 of multiplexer 144 through signal path 142d.

The output of delay element 140e is electrically coupled to input 5 of multiplexer 126, an input of delay element 140f, and input 5 of multiplexer 144 through signal path 142e. The output of delay element 140f is electrically coupled to input 6 of multiplexer 126, an input of delay element 140g, and input 6 of multiplexer 144 through signal path 142f. The output of delay element 140g is electrically coupled to input 7 of multiplexer 126, an input of delay element 140h, and input 7 of multiplexer 144 through signal path 142g. The output of delay element 140h is electrically coupled to input 8 of multiplexer 126, an input of delay element 140i, and input 8 of multiplexer 144 through signal path 142h. The output of delay element 140i is electrically coupled to input 9 of multiplexer 126 through signal path 142i.

A first output of multiplexer 126 is electrically coupled to a first input of phase detector 120 through signal path 128. A second output of multiplexer 126 is electrically coupled to a second input of phase detector 120 through signal path 130. The control input of multiplexer 144 receives the PS signal on PS signal path 112. A first output of multiplexer 144 is electrically coupled to a first input of interpolator 150 through signal path 146. A second output of multiplexer 144 is electrically coupled to a second input of interpolator 150 through signal path 148. The control input of interpolator 150 receives the IS signal on IS signal path 114. The output of interpolator 150 provides the CLKOUT signal on CLKOUT signal path 116.

Phase detector 120 receives the signal on signal path 128 and the signal on signal path 130 to provide the signal on signal path 122. Phase detector 120 determines the phase relationship between the signal on signal path 128 and the signal on signal path 130. Phase detector 120 outputs a signal on signal path 122 indicating the phase difference between the signal on signal path 128 and the signal on signal path 130.

Loop filter 124 receives the signal on signal path 122 to provide the signal on signal path 138. Loop filter 124 filters the signal on signal path 122 to avoid oscillation of the signal. By avoiding oscillation of the signal, sudden changes in the signal on signal path 138 are avoided. The signal on signal path 138 adjusts the delay of each delay element 140a-140i based on the signal on signal path 122.

Multiplexer 126 receives a control signal on signal path 134 and input signals on CLKIN signal path 110 and signal paths 142a-142i to provide the signal on signal path 128 and the signal on signal path 130. In response to the control signal on signal path 134, multiplexer 126 passes one of the signals on CLKIN signal path 110 and signals paths 142a-142i to signal path 128 and another one of the signals on CLKIN signal path 110 and signal paths 142a-142i to signal path 130.

Controller 132 includes a microprocessor, a microcontroller, a state machine, or other suitable logic circuitry. Controller 132 receives the signal on signal path 122 and provides the control signal on signal path 134 and the control signals on signal paths 136a-136i. Controller 132 is a resolution adjustment controller that provides individual control signals to independently adjust the delay of each delay element 140a-140i. Controller 132 controls multiplexer 126 to determine the phase difference between the signals on CLKIN signal path 110 and signal paths 142a-142i. The phase difference information is passed to controller 132 from phase detector 120 through signal path 122. Based on the phase difference information, controller 132 provides the individual control signals on signal paths 136a-136i such that the delay of each delay element 140a-140i, respectively, is equal.

Each delay element 140a-140i in the chain of delay elements receives an input signal, a first control signal on signal path 138, and a second control signal on signal path 136a-136i to provide an output signal on signal path 142a-142i, respectively. The delay of the input signal through each delay element 140a-140i is coarsely set based on the first common control signal on common signal path 138. The delay of the input signal through each delay element 140a-140i is finely set based on the second independent control signal on independent signal paths 136a-136i, respectively. The second independent control signals on independent signal paths 136a-136i are set such that the delay through each delay element 140a-140i is equal.

In one embodiment, each delay element 140a-140i delays its input signal by 22.5°. Therefore, the signal on signal path 142h is phase shifted with respect to the CLKIN signal by 180°. In other embodiments, another suitable number of delay elements are used such that each delay element 140a-140i delays its input signal an equal amount to provide the signal on signal path 142h phase shifted 180° with respect to the CLKIN signal. In one embodiment, the total delay of the delay elements is an integer fraction or multiple of the CLKIN signal frequency.

Multiplexer 144 receives the PS signal on PS signal path 112 and input signals on CLKIN signal path 110 and signal paths 142a-142h to provide the signal on signal path 146 and the signal on signal path 148. In response to the PS signal, multiplexer 144 passes one of the signals on CLKIN signal path 110 and signal paths 142a-142h to signal path 146 and another one of the signals on an adjacent signal path CLKIN signal path 110 and signal paths 142a-142h to signal path 148.

Interpolator 150 receives the IS signal on IS signal path 114, the signal on signal path 146, and the signal on signal path 148 to provide the CLKOUT signal on CLKOUT signal path 116. Interpolator 150 interpolates the signals on signal paths 146 and 148 based on the IS signal to provide the CLKOUT signal. Based on the IS signal, the phase of the CLKOUT signal is equal to or between the phase of the signal on signal path 146 and the phase of the signal on signal path 148. In this way, the CLKOUT signal is phase shifted from the CLKIN signal by a desired value.

Upon power up and/or another suitable time, controller 132 provides the independent adjustment signals on signal paths 136a-136i such that the delay of each delay element 140a-140i is equal. The transfer function ($t_i$) for each delay element (i) 140a-140i is a function ($f_i$) of the control signal (c) on signal path 138 and the control signal ($d_i$) on signal path 136a-136i, respectively, as follows:

$$t_i = f_i(c, d_i) \qquad \text{Equation 1}$$

Controller 132 sets the independent adjustment signals by solving a system of equations as follows:

$$t_1+t_2+t_3+t_4+t_5+t_6+t_7+t_8=180° \qquad \text{Equation 2}$$

$$t_2+t_3+t_4+t_5+t_6+t_7+t_8+t_9=180° \qquad \text{Equation 3}$$

$$t_1+t_3+t_4+t_5+t_6+t_7+t_8+t_9=180° \qquad \text{Equation 4}$$

$$t_1+t_2+t_4+t_5+t_6+t_7+t_8+t_9=180° \qquad \text{Equation 5}$$

$$t_1+t_2+t_3+t_5+t_6+t_7+t_8+t_9=180° \qquad \text{Equation 6}$$

$$t_1+t_2+t_3+t_4+t_6+t_7+t_8+t_9=180° \qquad \text{Equation 7}$$

$$t_1+t_2+t_3+t_4+t_5+t_7+t_8+t_9=180° \qquad \text{Equation 8}$$

$$t_1+t_2+t_3+t_4+t_5+t_6+t_8+t_9=180° \qquad \text{Equation 9}$$

$$t_1+t_2+t_3+t_4+t_5+t_6+t_7+t_9=180° \qquad \text{Equation 10}$$

There are nine unknowns (i.e., $t_1$-$t_9$) and nine equations (i.e., Equations 2-10), which provides one solution as follows:

$$t_1=t_2=t_3=t_4=t_5=t_6=t_7=t_8=t_9=180°/8=22.5° \qquad \text{Equation 11}$$

To solve for the control signal (c) on signal path 138 and control signals ($d_i$) on signal paths 136a-136i, there are nine equations for ten unknowns. This is overcome by adding an additional equation, such as:

$$\Sigma d_i = 0 \qquad \text{Equation 12}$$

or by setting one of the $d_i=0$, such as $d_9=0$. An ideal transfer function (t) of a delay element 140a-140i is given by:

$$t = \tau c \qquad \text{Equation 13}$$

For an on-chip variation (OCV) of a constant offset ($\delta_i$), the transfer function varies as follows:

$$t_i = \tau(c+\delta_i) = \tau c + \tau' \qquad \text{Equation 14}$$

In this case, the resolution adjustment control $d_i$ is added to c such that:

$$t_i = \tau((c+d_i)+\delta_i) \qquad \text{Equation 15}$$

For $d_i = -\delta_i$, Equation 15 provides a uniform distribution given by:

$$t_i = \tau c \qquad \text{Equation 16}$$

If the main on-chip variation effect is to vary the slope of the transfer function, such that:

$$t_i = \tau_i c \qquad \text{Equation 17}$$

then a multiplicative correction is built into each delay element 140a-140i such that:

$$t_i = \tau_i c(1+d_i) \qquad \text{Equation 18}$$

Therefore, with $d_9=0$, Equation 11 above is solved by setting:

$$\tau_1 c(1+d_1) = \tau_2 c(1+d_2) = \tau_3 c(1+d_3) = \tau_4 c(1+d_4) = \tau_5 c(1+d_5)$$
$$= \tau_6 c(1+d_6) = \tau_7 c(1+d_7) = \tau_8 c(1+d_8) = \tau_9 c = 22.5° \qquad \text{Equation 19}$$

and by setting:

$$d_i = \frac{\tau_9}{\tau_i} - 1 \qquad \text{Equation 20}$$

Therefore, $d_i$ is used to compensate the relative slope of each delay element 140a-140h versus delay element 140i. For more complex transfer functions for Equation 1 above, at least a first order correction using the Taylor series for $f_i$ can be used.

After controller 132 sets the delay of each delay element 140a-140i equal, DLL 108a provides the CLKOUT signal having the desired phase relation to the CLKIN signal. Controller 132 provides the control signal on signal path 134 such that multiplexer 126 passes the CLKIN signal (i.e., input 0 of multiplexer 126) to signal path 128 and passes the signal on signal path 142h (i.e., input 8 of multiplexer 126) to signal path 130. Phase detector 120 receives the two signals and determines the phase difference between the two signals. Phase detector 120 provides an output signal on signal path 122 based on the phase difference. Loop filter 124 receives the output signal from phase detector 120 and adjusts the control signal on signal path 138 such that the signal on signal path 142h is phase shifted 180° with respect to the CLKIN signal.

Multiplexer 144 selects two adjacent signals from delay elements 140a-140h (i.e., two adjacent inputs 0-8 of multiplexer 144) based on the PS signal to pass to interpolator 150 on signal paths 146 and 148. Interpolator 150 interpolates the two signals from multiplexer 144 based on the IS signal to provide the CLKOUT signal. The CLKOUT signal is phase shifted from the CLKIN signal by a selected amount and has high resolution between 0° and 180°. In one embodiment, multiplexer 144 can invert the phase of the signals received on multiplexer inputs 0-8, such that the CLKOUT signal is phase shifted from the CLKIN signal by a selected amount between 0° and 360°.

Figure 3:
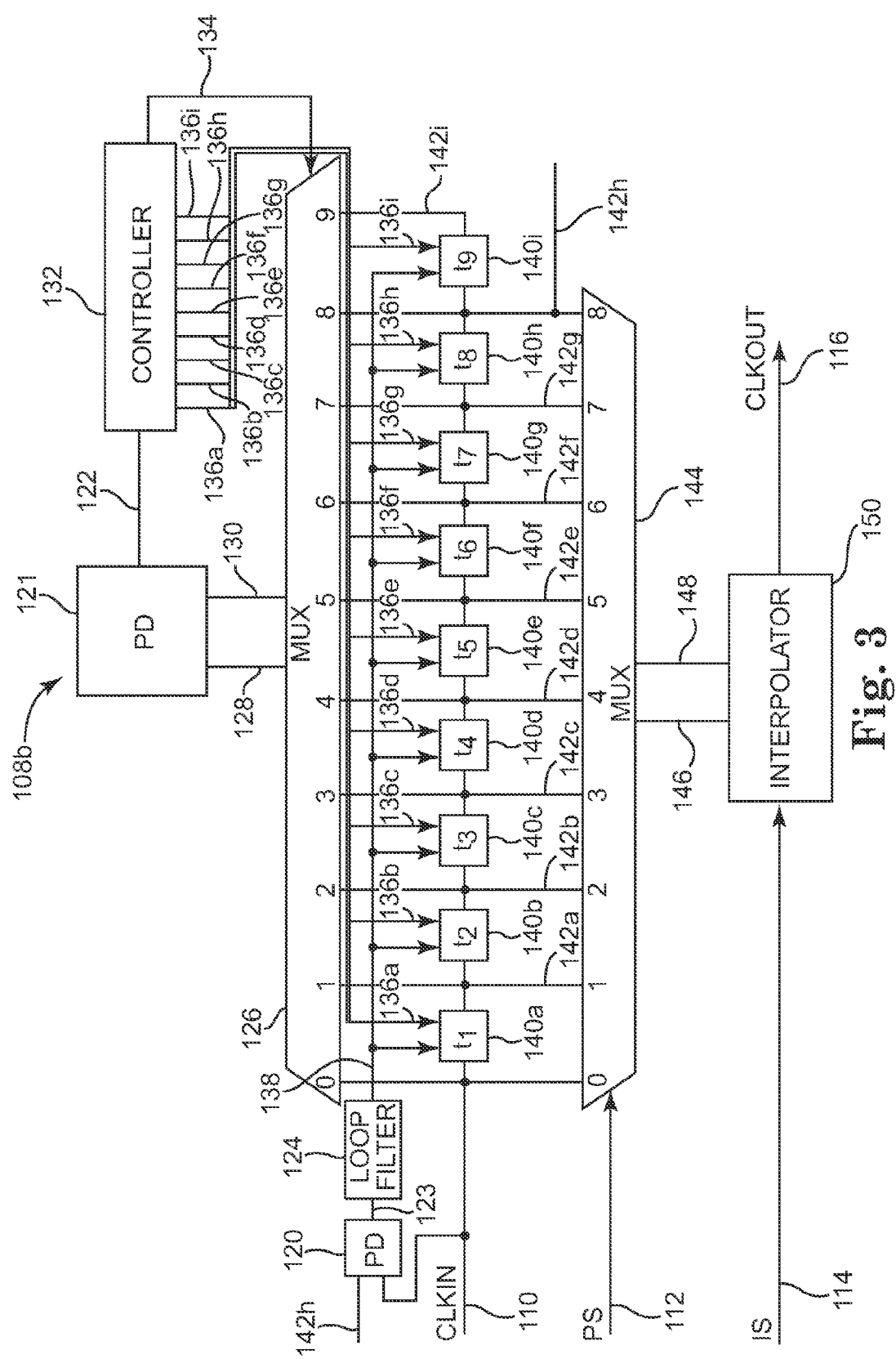
FIG. 3 is a block diagram illustrating another embodiment of a DLL.

FIG. 3 is a block diagram illustrating another embodiment of a DLL 108b. In one embodiment, DLL 108b provides DLL 108 previously described and illustrated with reference to FIG. 1. DLL 108b is similar to DLL 108a previously described and illustrated with reference to FIG. 2, except that DLL 108b includes an additional phase detector 121.

A first input of phase detector 121 is electrically coupled to a first output of multiplexer 126 through signal path 128. A second input of phase detector 121 is electrically coupled to a second output of multiplexer 126 through signal path 130. The output of phase detector 121 is electrically coupled to the input of controller 132 through signal path 122. A first input of phase detector 120 is electrically coupled to the output of delay element 140h through signal path 142h. A second input of phase detector 120 receives the CLKIN signal on CLKIN signal path 110. The output of phase detector 120 is electrically coupled to the input of loop filter 124 through signal path 123.

Phase detector 120 receives the signal on signal path 142h and the CLKIN signal on CLKIN signal path 110 to provide the signal on signal path 123. Phase detector 120 determines the phase relationship between the signal on signal path 142h and the CLKIN signal. Phase detector 120 outputs a signal on signal path 123 indicating the phase difference between the signal on signal path 142h and the CLKIN signal.

Phase detector 121 receives the signal on signal path 128 and the signal on signal path 130 to provide the signal on signal path 122. Phase detector 121 determines the phase relationship between the signal on signal path 128 and the signal on signal path 130. Phase detector 121 outputs a signal on signal path 122 indicating the phase difference between the signal on signal path 128 and the signal on signal path 130. Controller 132, loop filter 124, multiplexers 126 and 144, delay elements 140a-140i, and interpolator 150 operate similarly as previously described and illustrated with reference to FIG. 2.

During operation of this embodiment, phase detector 121 is dedicated to controller 132 for determining the independent adjustment signals on signal paths 136a-136i. Therefore, controller 132 does not disturb the closed loop provided by phase detector 120 and loop filter 124, which provide the common control signal on signal path 138 based on the CLKIN signal and the signal on signal path 142h.

Embodiments provide a delay locked loop including a controller for individually adjusting the delay of each delay element in a chain of delay elements. In this way, the delay of each delay element in the chain of delay elements is set equal. With the delay of each delay element set equal, the resolution of the delay locked loop is improved compared to a delay locked loop where the delay of each delay element is not equal due to on-chip variations.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a chain of delay elements configured to delay an input clock signal for providing an output clock signal phase shifted with respect to the input clock signal by a selected value;
a first phase detector configured to provide a common control signal to each delay element based on a phase difference between the input clock signal and a signal output from one of the delay elements to adjust a delay of each delay element; and
a controller configured to provide an independent control signal to each delay element to individually adjust the delay of each delay element such that the delay of each delay element is equal.

2. The integrated circuit of claim 1, further comprising:
a multiplexer configured for selecting a first signal input to a selected one of the delay elements and a second signal output from the selected one of the delay elements; and
an interpolator configured to interpolate the first signal and the second signal to provide the output clock signal.

3. The integrated circuit of claim 1, wherein the chain of delay elements comprises nine delay elements and the input clock signal is provided to a first delay element in the chain of delay elements.

4. The integrated circuit of claim 3, wherein the first phase detector is configured to provide the common control signal to each delay element based on a phase difference between the input clock signal and a signal output from an eighth delay element in the chain of delay elements to adjust a delay of each delay element such that the signal output from the eighth delay element is phase shifted 180° from the input clock signal.

5. The integrated circuit of claim 3, wherein the controller is configured to solve a series of equations to provide the independent control signal for each of the delay elements, each equation including setting a sum of the delays through eight of the delay elements equal to 180°.

6. The integrated circuit of claim 1, further comprising:
a multiplexer configured for selecting two signals from the group of signals comprising the input clock signal and each signal output from each of the delay elements to pass to the first phase detector.

7. The integrated circuit of claim 6, wherein the controller is configured to provide a control signal to the multiplexer for selecting the two signals.

8. The integrated circuit of claim 1, further comprising:
a loop filter configured to filter the common control signal.

9. The integrated circuit of claim 1, further comprising:
a second phase detector configured to provide a phase difference signal to the controller; and
a multiplexer configured for selecting two signals from the group of signals comprising the input clock signal and each signal output from each of the delay elements to pass to the second phase detector,
wherein the controller is configured to provide a control signal to the multiplexer for selecting the two signals.

10. A system comprising:
a host; and
a device communicatively coupled to the host, the device including a delay locked loop comprising:
a chain of delay elements configured to delay an input clock signal for providing an output clock signal phase shifted with respect to the input clock signal by a selected value;
a first phase detector configured to provide a common control signal to each delay element based on a phase difference between the input clock signal and a signal output from one of the delay elements to adjust a transfer function of each delay element; and a controller configured to provide an independent control signal to each delay element to individually adjust the transfer function of each delay element such that the delay of each delay element is equal.

11. The system of claim 10, wherein the device comprises a memory device.

12. The system of claim 10, wherein the host is configured to pass the input clock signal to the device.

13. The system of claim 10, wherein the device is configured to synchronously transfer information to the host in response to the output clock signal.

14. The system of claim 10, wherein the device further comprises:

a multiplexer configured for selecting a first signal input to a selected one of the delay elements and a second signal output from the selected one of the delay elements; and an interpolator configured to interpolate the first signal and the second signal to provide the output clock signal.

15. The system of claim 10, wherein the device further comprises:

a multiplexer configured for selecting two signals from the group of signals comprising the input clock signal and each signal output from each of the delay elements to pass to the first phase detector.

16. The system of claim 15, wherein the controller is configured to provide a control signal to the multiplexer for selecting the two signals.

17. The system of claim 10, wherein the device further comprises:

a second phase detector configured to provide a phase difference signal to the controller; and a multiplexer configured for selecting two signals from the group of signals comprising the input clock signal and each signal output from each of the delay elements to pass to the second phase detector, wherein the controller is configured to provide a control signal to the multiplexer for selecting the two signals.

18. A method for generating an output clock signal, the method comprising:

delaying an input clock signal through a chain of delay elements;

providing a common control signal to each delay element to commonly adjust a delay of each delay element based on a phase difference between the input clock signal and an output signal from one of the delay elements;

providing an independent control signal to each delay element to independently adjust the delay of each delay element such that the delay of each delay element is equal; and providing the output clock signal based on a signal output from a selected one of the delay elements such that the output clock signal has a selected phase relation to the input clock signal.

19. The method of claim 18, wherein providing the output clock signal comprises interpolating between a signal input to the selected one of the delay elements and the signal output from the selected one of the delay elements based on an interpolation select signal.

20. The method of claim 19, further comprising:

selecting the signal input to the selected one of the delay elements and the signal output from the selected one of the delay element based on a phase select signal.

21. The method of claim 18, further comprising:
filtering the common control signal.

22. The method of claim 18, further comprising:
determining the independent control signal for each delay element based on phase differences between each signal output from each delay element.

* * * * *